United States Patent
Baumgartner

(10) Patent No.: US 7,053,521 B2
(45) Date of Patent: May 30, 2006

(54) METHOD FOR ENHANCING EPOXY ADHESION TO GOLD SURFACES

(75) Inventor: Charles E. Baumgartner, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 179 days.

(21) Appl. No.: 10/705,266

(22) Filed: Nov. 10, 2003

(65) Prior Publication Data

US 2005/0099089 A1    May 12, 2005

(51) Int. Cl.
    *H01L 41/08*    (2006.01)
(52) U.S. Cl. .................. 310/311; 310/348; 310/363; 29/25.35; 156/299
(58) Field of Classification Search .............. 310/311, 310/348, 363; 29/25.35; 156/299
    See application file for complete search history.

(56) References Cited

FOREIGN PATENT DOCUMENTS

| JP | 6-122766 | * | 5/1994 | ................ 525/537 |
| JP | 08-183944 | * | 7/1996 | |
| JP | 11-171937 | * | 6/1999 | |

* cited by examiner

*Primary Examiner*—Thomas M. Dougherty
(74) *Attorney, Agent, or Firm*—Fletcher Yoder

(57) ABSTRACT

A method for bonding one surface to a gold surface comprises the following steps: (a) mixing a solution containing sulfur-containing alkoxysilane; (b) treating the gold surface with the solution; (c) adding sulfur-containing alkoxysilane to an adhesive material; (d) applying the adhesive material with additive on one of both surfaces; and (e) pressing the surfaces against each other while the adhesive material therebetween sets.

13 Claims, 2 Drawing Sheets

MERCAPTOPROPYL TRIMETHOXYSILANE

DISULFIDEPROPYL TRIETHOXYSILANE

AMINOPROPYL TRIETHOXYSILANE

DIPHENYLPHOSPHINE TRIETHOXYSILANE

METHOD FOR ENHANCING EPOXY ADHESION TO GOLD SURFACES

BACKGROUND OF THE INVENTION

This invention generally relates to methods for making electrical connections. In particular, the invention relates to methods for electrically connecting one electrical conductor to another when one or both of the electrical conductors have a gold surface.

Flexible printed circuits ("flex circuits") and numerous other metallized substrates often have gold as the final metal layer exposed to the ambient atmosphere. The gold surface is very stable and therefore is typically not changed during storing. However, the same physical property that provides for excellent environmental stability also makes bonding to the gold surface very difficult. It is well known in the art that the level of adhesion which forms between an epoxy and the surface of a gold-plated flex circuit is lower than that which forms between an epoxy and many other metals. However, because of its excellent environmental stability, gold continues to be a preferred final metal layer for many applications.

Some ultrasound transducers are manufactured by bonding a flex circuit to the surface of the piezoelectric ceramic prior to dicing of the individual piezoelectric elements. In many cases gold is selected as the final metal layer for both the surface of the ceramic and the surface of the flex circuit. A common process used to connect the flex circuit to the piezoelectric ceramic is lamination with a thin epoxy bond. Low bond strength across the ceramic-to-flex circuit bond can lead to delamination of the flex circuit from the piezoelectric ceramic during the dicing process or other processing step, resulting in a nonfunctioning piezoelectric element. Therefore it is desirable to substantially increase the strength of this epoxy bond to the gold surface.

Several commercial primers are available for treating the gold surface to promote bonding. Many of these primers are sulfur-containing alkoxysilanes. These primers increase the bond strength of an epoxy bonded to the gold surface relative to either no primer or a non-sulfur-containing alkoxysilane primer when used in the recommended surface treatment method There is a need for means for further increasing the epoxy-to-gold bond strength of gold-to-other metal and gold-to-gold electrical connections.

BRIEF DESCRIPTION OF THE INVENTION

The present invention is based on the discovery that the level of adhesion that forms between an epoxy and a gold metal layer is significantly increased by the addition of a sulfur-containing silane primer directly to the epoxy formulation. In general terms, the invention is directed to both a method for improving of the adhesion of bonding material to gold surfaces in laminated structures and the resulting laminated structure. The invention has particular application in the field of ultrasound imaging, where an increase in adhesion will facilitate the development of new ultrasound imaging probes in which the piezoelectric elements are smaller in size and more numerous, such as are present in multi-row or two-dimensional arrays.

One aspect of the invention is a method for bonding a first surface to a second surface made of gold, comprising the following steps: (a) mixing a solution comprising sulfur-containing alkoxysilane; (b) treating the gold surface with the solution; (c) adding sulfur-containing alkoxysilane to an adhesive material; (d) applying the adhesive material to the gold surface, to a surface of the layer of material or both; and (e) pressing the gold surface and the first surface against each other while the adhesive material therebetween sets.

Another aspect of the invention is a method for laminating a first substrate to a second substrate, the mutually confronting surfaces of at least one of the first and second substrates being covered at least partially with gold, comprising the following steps: (a) mixing a solution comprising sulfur-containing alkoxysilane; (b) treating each gold confronting surface with the solution; (c) adding sulfur-containing alkoxysilane to an adhesive material; (d) applying the adhesive material on at least one of the confronting surfaces of the first and second substrates; and (e) holding the first and second substrates in a fixed relationship while the adhesive material therebetween sets.

A further aspect of the invention is a structure comprising cured epoxy bonded to a gold surface, wherein the epoxy has a sulfur-containing alkoxysilane blended therein.

Yet another aspect of the invention is a laminated structure comprising first and second substrates having mutually confronting surfaces, the mutually confronting surfaces of at least one of the first and second substrates being covered at least partially with gold, and the mutually confronting surfaces being bonded by a thin layer of adhesive material, wherein the adhesive material has an adhesion-promoting agent blended therein, the adhesion-promoting agent being a sulfur-containing alkoxysilane.

A further aspect of the invention is an ultrasound transducer device comprising: an array of ultrasound transducer elements, each of the ultrasound transducer elements comprising a respective terminal made of electrically conductive material; a printed circuit comprising an array of traces or pads, the pads or traces being made of electrically conductive material, each pad or trace confronting the terminal of a respective one of the ultrasound transducer elements, the pads or traces being substantially electrically isolated from each other; and a thin layer of adhesive material disposed between the printed circuit and the array of ultrasound transducer elements, wherein the adhesive material has an adhesion-promoting agent blended therein, the adhesion-promoting agent being a sulfur-containing alkoxysilane.

Other aspects of the invention are disclosed and claimed below.

DETAILED DESCRIPTION OF THE INVENTION

Alkoxysilanes are one of the most common forms of adhesion promoter used to enhance bond strength. These types of primers are often used in a diluted form by addition to an alcohol or alcohol plus water solution. The concentration of alkoxysilane in solution may lie in the range of 0.1 to 10%. A typical concentration of alkoxysilane in solution is 1%. The substrate to be bonded is placed into the primer solution for a period of time, removed from the solution, rinsed to remove excess primer, and then dried before bonding. Sulfur-containing alkoxysilanes are the recommended form of adhesion promoter for bonding to gold surfaces. When used in the above process, the bond strength of most epoxies to the gold surface will be stronger than a comparable epoxy bond without the primer present.

Figure 1:
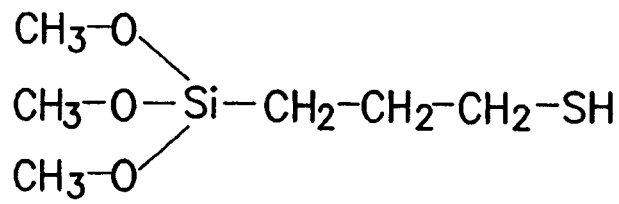
FIG. 1 is a drawing showing the chemical structure of mercaptopropyl trimethoxysilane.
Figure 2:
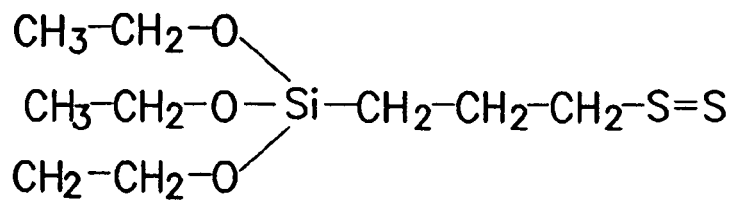
FIG. 2 is a drawing showing the chemical structure of disulfidepropyl triethoxysilane.
Figure 3:
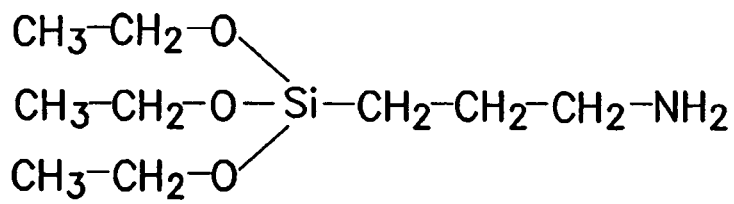
FIG. 3 is a drawing showing the chemical structure of aminopropyl triethoxysilane.
Figure 4:
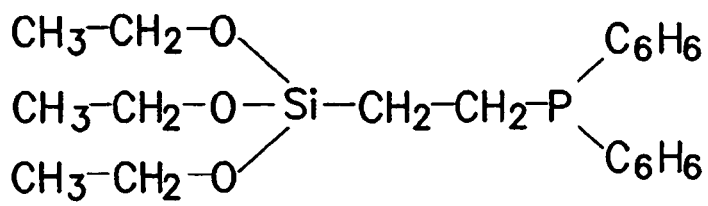
FIG. 4 is a drawing showing the chemical structure of diphenylphosphine triethoxysilane.

However, it was an unexpected discovery that the epoxy bond strength can be significantly increased even further if the sulfur-containing alkoxysilane is added directly to the epoxy formulation in addition to its use as a surface treatment. A process design of experiments (DOE) was performed to optimize the epoxy bond strength to gold-plated flex circuit material. The DOE looked at the use of an alkoxysilane adhesion promoter, the type of adhesion promoter in terms of its chemistry, and whether or not the adhesion promoter was added to the epoxy formulation. Two alkoxysilane adhesion promoters contained sulfur in their structure to promote bonding to a gold surface. These were mercaptopropyl trimethoxysilane (M8500) and disulfidepropyl triethoxysilane (B2494). The chemical structures of mercaptopropyl trimethoxysilane and disulfidepropyl triethoxysilane are respectively shown in FIGS. 1 and 2. Two additional alkoxysilane adhesion promoters, which did not contain sulfur in their structure, were aminopropyl triethoxysilane (P220) and diphenylphosphine triethoxysilane (D6110). The chemical structures of aminopropyl triethoxysilane and diphenylphosphine triethoxysilane are respectively shown in FIGS. 3 and 4.

Peel adhesion tests were made for each of these alkoxysilanes for epoxy bonded to a surface of gold-plated flex circuit material. In each case the surface of the gold was treated with the alkoxysilane from a 1% solution in isopropyl alcohol as per the process described above. One half of the samples also had the same alkoxysilane added to the epoxy formulation at a concentration of 1%. The epoxy used was a commercial bisphenol-A epoxy resin cured at 50° C. using an aliphatic amine curing agent. Bonded to the gold surface was a 1-cm-wide strip of 0.05-mm-thick polyimide film with 0.02 mm of copper plated onto the back side to provide support for adhesion testing. Adhesive bond strength was measured by peeling the copper-backed polyimide film from the gold surface at a 90 degree angle and a rate of 2 inches/minute. The adhesion data was converted to pounds/inch (pli) of width by multiplying the recorded peel force by 2.54. Peel adhesion data was acquired for samples using no alkoxysilane adhesion promoter, samples wherein the gold surface was treated with various alkoxysilane adhesion promoters, and samples wherein various alkoxysilane adhesion promoters were both applied to the gold surface and added to the epoxy formulation. The peel adhesion data, presented in Table 1 (values are in pli), showed that the adhesive bond strength is significantly greater when a sulfur-containing alkoxysilane (M8500 or B2494) is added to the epoxy formulation. In all cases adhesive failure occurred via epoxy removal from the gold surface. No other factors in the DOE were similarly significant in increasing the adhesive strength to the gold surface.

TABLE 1

| Treatment | None | P220 | D6110 | M8500 | B2494 |
|---|---|---|---|---|---|
| Onto Surfaces | 0.5 | 0.9 | 0.6 | 1.3 | 1.5 |
| Into Epoxy | 0.6 | 1.1 | 0.6 | 4.2 | 4.6 |

As shown above, by adding 1% of a sulfur-containing alkoxysilane to the epoxy formulation, the bond strength of the resulting epoxy formulation can be increased by a factor of 3 or more. The amount of sulfur-containing alkoxysilane added may range from 0.1 to 10%. While this teaching has application to any structure in which epoxy is being used to bond a substrate to a gold surface, it can greatly increase the bond strength between a gold-plated flex circuit and a gold-plated piezoelectric ceramic element in an ultrasound probe This increase in bond strength will be beneficial in ultrasound probe manufacture by increasing the robustness of the lamination process and facilitate successful commercialization of new multi-row ultrasound arrays in which the size of the piezoelectric element is much smaller than those commonly used in the prior art.

Many ultrasonic transducers are phased arrays comprising single or multiple rows of electrically and mechanically independent transducer elements. In these types of transducers, each transducer element may be a layered structure comprising an acoustic absorber, a piezoelectric ceramic layer, one or more acoustic matching layers, and a front wear plate or focusing lens. Typically, one or more flex circuits are used to make electrical connections (signal and ground) from the piezoelectric ceramic layer to the signal processing electronics, or to a bundle of coaxial cables that ultimately connect to the signal processing electronics.

Electrical connections to the piezoelectric ceramic in ultrasound transducers must meet requirements of low electrical resistivity and high bond strength while not impacting the acoustic performance. The piezoelectric ceramic in ultrasound transducers is often bonded to a flexible printed circuit board (hereinafter "flex circuit") or other electrical connector using a thin epoxy bond. This bond joint needs to be electrically conductive for the applied voltage to be converted to mechanical energy by the piezoelectric material.

Figure 5:
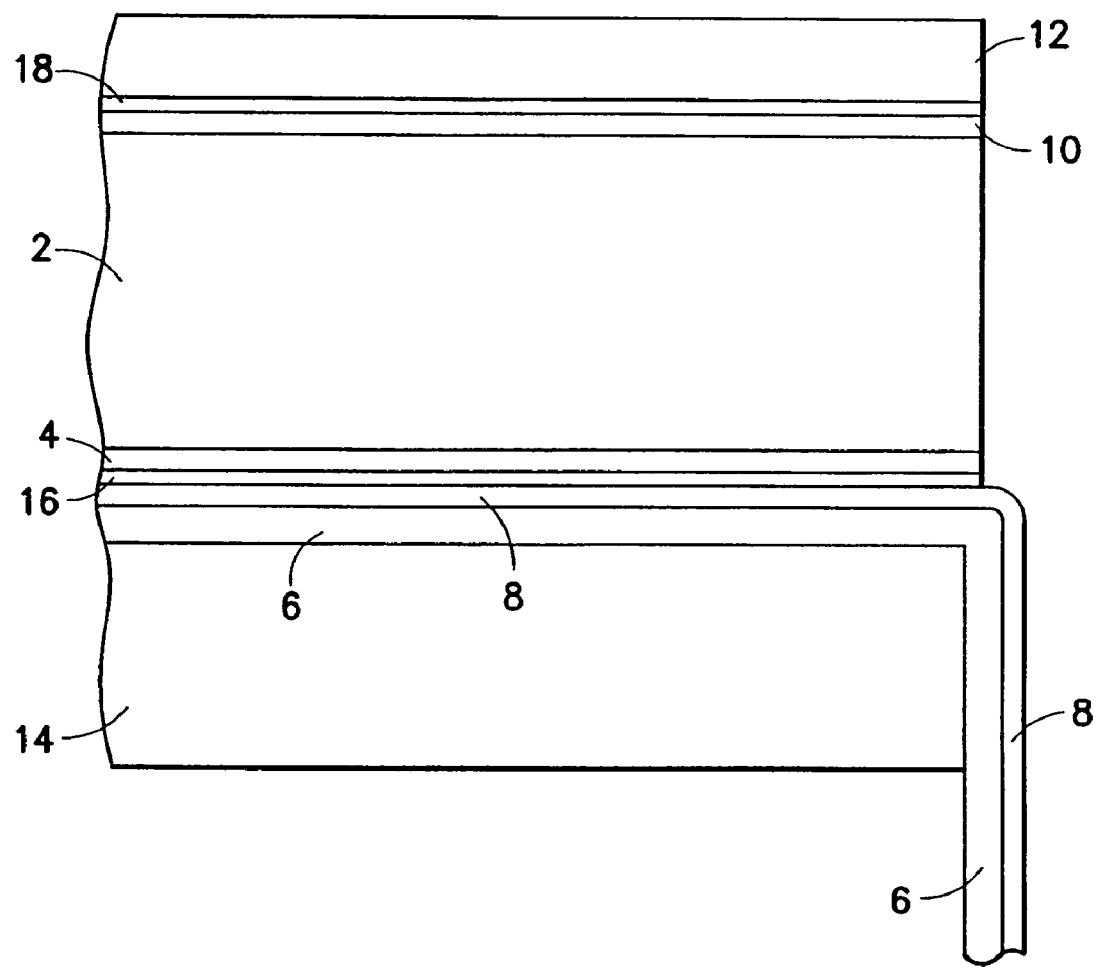
FIG. 5 is a drawing showing a laminated structure of an exemplary ultrasound transducer element in which an electrical connection can be made using an epoxy formulation having a sulfur-containing silane additive in accordance with one embodiment of the present invention.

FIG. 5 shows an exemplary interface between a piezoelectric ceramic layer 2 having a bottom surface that has been metallized to form a signal electrode 4 and a flex circuit comprising a dielectric film 6 (e.g., Kapton® polyimide) having a pattern of metallization 8 (e.g., a metal trace) on a surface opposed to the signal electrode 4. Alternatively, the metallization 8 may comprise an exposed metal pad that is electrically coupled by means of a metallized via to a conductive trace that lies at a different level in the flex circuit substrate. The flex circuit is optionally supported by and joined to a layer of acoustically attenuative material 14, i.e., a so-called "acoustic backing layer". In accordance with an alternative embodiment, the flex circuit can be embedded in the acoustic backing layer with the end of a metal trace (or a pad connected to the end of a metal trace) exposed at the interface with and bonded to the signal electrode on the piezoelectric ceramic layer. The top surface of the piezoelectric ceramic layer 2 is also metallized to form a ground electrode 10, which is typically electrically connected to an acoustic impedance matching layer 12 made of electrically conductive material that is connected to common ground.

The acoustic impedance matching layer 12 is joined to the metallized top surface of the transducer element using an acoustically transparent thin layer of adhesive 18. Likewise the flex circuit is joined to the metallized bottom surface of the transducer element using an acoustically transparent thin layer of adhesive 16. Although each adhesive layer is depicted as occupying a gap between the opposing surfaces, in reality the adhesive layers allow ohmic contact between the electrically conductive surfaces, as previously explained above.

In accordance with one embodiment of the present invention, the metallization on the top and bottom surfaces of the piezoelectric ceramic layer is gold, as is the metallization on the dielectric substrate 6, but the acoustic impedance matching layer 12 is not made of gold. Thus the embodiment depicted in FIG. 5 demonstrates the use of the present invention to make electrical connection between two gold surfaces and between a gold surface and another surface not made of gold. In each instance, the adhesive layer comprises an epoxy (e.g., a bisphenol-A epoxy resin cured at 50° C. using an aliphatic amine curing agent) comprising a concentration of 1% of a sulfur-containing alkoxysilane, such as mercaptopropyl trimethoxysilane or disulfidepropyl triethoxysilane.

In accordance with one embodiment of the invention, a strong gold-to-gold bond in the example depicted in FIG. 5 can be achieved using a method comprising the following steps: (a) mixing a solution comprising sulfur-containing alkoxysilane (0.1 to 10%, preferably 1.0 to 5.0%); (b) adding sulfur-containing alkoxysilane (0.1 to 10%, preferably 1.0 to 5.0%) to the epoxy formulation; (c) treating each of gold surfaces 4 and 8 with the solution; (d) applying the epoxy with additive on either or both surfaces; and (e) pressing the gold surfaces 4, 8 against each other while the epoxy 16 sets. The same method applies for bonding the acoustic impedance matching layer to the ground electrode except that only the gold surface, and not the surface of the matching layer, needs to be rinsed.

To obtain a bond with sufficiently low electrical resistivity for ultrasound transducers, a high pressure is commonly applied to the bond interface prior to and during curing of the epoxy. If the flex circuit and piezoelectric ceramic surfaces are microscopically rough and the epoxy layer is sufficiently thin, then an electrical connection is achieved via a distribution of direct contacts between high points on the piezoelectric ceramic surface and high points on the flex circuit. Under sufficient pressure, metallized asperities on the ceramic penetrate through the epoxy bond to make direct contact with the flex circuit. Thin epoxy bonds can provide low electrical resistivity and acceptable acoustic properties.

The process of adding a sulfur-containing alkoxysilane to the epoxy formulation was instrumental to the successful development of a two-dimensional ultrasound transducer array in which two gold-plated surfaces are bonded together with a thin epoxy bond. This transducer array was diced following the lamination process. Trials using an epoxy formulation without a sulfur-containing alkoxysilane produced transducer arrays possessing elements in which the epoxy had failed to support the element. No epoxy bond failures have been seen using the process disclosed herein.

While the invention has been described with reference to preferred embodiments, it will be understood by those skilled in the art that various changes may be made and equivalents may be substituted for elements thereof without departing from the scope of the invention. In addition, many modifications may be made to adapt a particular situation to the teachings of the invention without departing from the essential scope thereof. Therefore it is intended that the invention not be limited to the particular embodiment disclosed as the best mode contemplated for carrying out this invention, but that the invention will include all embodiments falling within the scope of the appended claims.

The invention claimed is:

1. A method for laminating a first substrate to a second substrate, the mutually confronting surfaces of at least one of said first and second substrates being covered at least partially with gold, comprising the following steps:

mixing a solution comprising sulfur-containing alkoxysilane;

treating each gold confronting surface with the solution;

adding sulfur-containing alkoxysilane to an adhesive material;

applying the adhesive material on at least one of the confronting surfaces of said first and second substrates; and holding said first and second substrates in a fixed relationship while the adhesive material therebetween sets.

2. The method as recited in claim 1, wherein the concentration of sulfur-containing alkoxysilane in the solution is in the range of 0.1 to 10%.

3. The method as recited in claim 1, wherein the concentration of sulfur-containing alkoxysilane in the adhesive material is in the range of 0.1 to 10%.

4. The method as recited in claim 1, wherein the sulfur containing alkoxysilane is mercaptopropyl trimethoxysilane.

5. The method as recited in claim 1, wherein the sulfur-containing alkoxysilane is disulfidepropyl triethoxysilane.

6. The method as recited in claim 1, wherein the adhesive material is bispheno-A epoxy resin cured using an aliphatic amine.

7. A laminated structure comprising first and second substrates having mutually confronting surfaces, the mutually confronting surfaces of at least one of said first and second substrates being covered at least partially with gold, and the mutually confronting surfaces being bonded by a thin layer of adhesive material, wherein the adhesive material has an adhesion-promoting agent blended therein, said adhesion-promoting agent being a sulfur-containing alkoxysilane.

8. The laminated structure as recited in claim 7, wherein the concentration of sulfur-containing alkoxysilane in the adhesive material is about 1%.

9. The laminated structure as recited in claim 7, wherein the sulfur-containing alkoxysilane is mercaptopropyl trimethoxysilane.

10. The laminated structure as recited in claim 7, wherein the sulfur-containing alkoxysilane is disulfidepropyl triethoxysilane.

11. The laminated structure as recited in claim 7, wherein the adhesive material is bisphenol-A epoxy resin cured using an aliphatic amine.

12. The laminated structure as recited in claim 7, wherein both of the mutually confronting surfaces are at least partially covered with gold.

13. The laminated structure as recited in claim 7, wherein said first substrate is made of piezoelectric ceramic material and said second substrate is made of dielectric material.

* * * * *